United States Patent
Hwang et al.

(10) Patent No.: US 8,130,803 B2
(45) Date of Patent: Mar. 6, 2012

(54) LIGHT EMITTING DEVICE

(75) Inventors: Jongil Hwang, Kawasaki (JP); Shinji Saito, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 584 days.

(21) Appl. No.: 12/299,186

(22) PCT Filed: Sep. 4, 2008

(86) PCT No.: PCT/JP2008/066366
§ 371 (c)(1),
(2), (4) Date: Oct. 31, 2008

(87) PCT Pub. No.: WO2009/116192
PCT Pub. Date: Sep. 24, 2009

(65) Prior Publication Data
US 2010/0172388 A1    Jul. 8, 2010

(30) Foreign Application Priority Data
Mar. 19, 2008  (JP) .................. 2008-072056

(51) Int. Cl.
H01S 3/04 (2006.01)
G02B 6/00 (2006.01)
H01L 33/00 (2010.01)

(52) U.S. Cl. ............... 372/43.01; 362/551; 362/555

(58) Field of Classification Search ......... 372/43.01; 362/259–260
See application file for complete search history.

(56) References Cited

U.S. PATENT DOCUMENTS

| | | | |
|---|---|---|---|
| 4,958,355 A | 9/1990 | Alphonse et al. | |
| 6,653,765 B1 | 11/2003 | Levinson et al. | |
| 6,686,676 B2 * | 2/2004 | McNulty et al. | 313/112 |
| 6,746,295 B2 * | 6/2004 | Sorg | 445/24 |
| 7,245,072 B2 * | 7/2007 | Ouderkirk et al. | 313/502 |

(Continued)

FOREIGN PATENT DOCUMENTS

| | | |
|---|---|---|
| JP | 3 192777 | 8/1991 |
| JP | 2006 32370 | 2/2006 |
| JP | 2007 27751 | 2/2007 |
| JP | 3991961 | 8/2007 |

OTHER PUBLICATIONS

U.S. Appl. No. 12/143,382, filed Jun. 20, 2008, Mitsuishi, et al.

(Continued)

Primary Examiner — Jessica Stultz
Assistant Examiner — Phillip Nguyen
(74) Attorney, Agent, or Firm — Oblon, Spivak, McClelland, Maier & Neustadt, L.L.P.

(57) ABSTRACT

A light emitting device includes: a semiconductor laser element having a first emission face for emitting laser light; a light guiding body buried in the concave portion of the supporting base, guiding the laser light emitted from the semiconductor laser element, and having an incident face to which the laser light enters, and a second emission face from which the laser light traveling through the light guiding body is emitted, the incident face of the light guiding body being such a curved face that an incident angle of the laser light is within a predetermined range including the Brewster angle in a plane formed by a traveling direction of the laser light and a short axis of a light emitting spot of the laser light; and a fluorescent substance scattered in the light guiding body, absorbing the laser light, and emitting the light having a different wavelength from a wavelength of the laser light.

22 Claims, 6 Drawing Sheets

U.S. PATENT DOCUMENTS

| | | | |
|---|---|---|---|
| 7,359,422 B2 * | 4/2008 | Fujitani | 372/92 |
| 7,889,421 B2 * | 2/2011 | Narendran et al. | 359/326 |
| 2004/0012027 A1 | 1/2004 | Keller et al. | |
| 2004/0145913 A1 | 7/2004 | Ouderkirk et al. | |
| 2006/0034084 A1 * | 2/2006 | Matsuura et al. | 362/293 |
| 2006/0139926 A1 | 6/2006 | Morioka et al. | |
| 2006/0291246 A1 | 12/2006 | Hattori et al. | |
| 2007/0012940 A1 | 1/2007 | Suh et al. | |
| 2007/0228390 A1 | 10/2007 | Hattori et al. | |
| 2008/0117500 A1 * | 5/2008 | Narendran et al. | 359/326 |

OTHER PUBLICATIONS

International Preliminary Report on Patentability and Written Opinion of the International Searching Authority issued Sep. 21, 2010, in Patent Application No. PCT/JP2008/066366, filed Sep. 4, 2008.
U.S. Appl. No. 12/876,738, filed Sep. 7, 2010, Hattori, et al.
U.S. Appl. No. 12/876,675, filed Sep. 7, 2010, Hattori, et al.
Korean Office Action issued Sep. 21, 2011, in Patent Application No. 10-2010-7020928 (with English-language translation).

* cited by examiner

LIGHT EMITTING DEVICE

BACKGROUND OF THE INVENTION

1. Field of the Invention

The present invention relates to a light emitting device that uses a semiconductor laser as a light source.

2. Related Art

Today, there are light emitting devices each having a light emitting diode as a semiconductor light emitting element, and each of the light emitting devices is designed to emit light uniformly within the device. By a known technique, for example, a reflecting mirror is provided near a light emitting diode, so as to adjust the light traveling direction and the spatial distribution of the light density. By another known technique, a light diffusion agent as well as a fluorescent substance is contained in a sealing agent that guides the light from a light emitting diode, and the diffused reflection is utilized. By yet another known technique, the spatial distribution of light density is adjusted by changing the shapes of the incident face and the emission face of the light guiding body (see Japanese Patent No. 3,991,961 and JP-A 2006-32370 (KOKAI), for example). Also, there is a known technique by which a sealing agent having a high refractive index is used to efficiently re-extract the light from a fluorescent substance and direct the light toward the emission face side (see JP-A 2007-27751 (KOAKI), for example).

However, any of those techniques is based on the principles of light reflection and transmission. By any of those techniques, a certain ratio of transmission light and a certain ratio of reflected light are not used for light emission from light emitting devices. Therefore, the transmission light and reflected light cause loss, and a high light emitting efficiency is not achieved.

SUMMARY OF THE INVENTION

The present invention has been made in view of these circumstances, and an object thereof is to provide a light emitting device that has the highest possible light emitting efficiency.

A light emitting device according to a first aspect of the present invention includes: a semiconductor laser element having a first emission face for emitting laser light; a supporting base having a concave portion on a surface, and supporting the semiconductor laser element in such a manner that the emission face of the semiconductor laser element is exposed to a bottom face of the concave portion; a light guiding body buried in the concave portion of the supporting base, guiding the laser light emitted from the semiconductor laser element, and having an incident face to which the laser light enters, and a second emission face from which the laser light traveling through the light guiding body is emitted, the incident face of the light guiding body being such a curved face that an incident angle of the laser light is within a predetermined range including the Brewster angle in a plane formed by a traveling direction of the laser light and a short axis of a light emitting spot of the laser light; and a fluorescent substance scattered in the light guiding body, absorbing the laser light, and emitting the light having a different wavelength from a wavelength of the laser light.

A light emitting device according to a second aspect of the present invention includes: first and second semiconductor laser elements having a first and second emission faces for emitting laser light respectively; a supporting base having a concave portion on a surface, and supporting the first and second semiconductor laser elements in such a manner that the first and second emission faces are exposed to a bottom face of the concave portion; a light guiding body buried in the concave portion of the supporting base, guiding the laser light emitted from each of the first and second semiconductor laser elements, and having an incident face to which the laser light emitted from the each of the first and second semiconductor laser elements enters and a third emission face from which the laser light traveling through the light guiding body is emitted, the incident face of the light guiding body being such a curved face that an incident angle of the laser light is within a predetermined range including the Brewster angle in a plane formed by a traveling direction of the laser light and a short axis of a light emitting spot of the laser light; and a fluorescent substance scattered in the light guiding body, absorbs the laser light, and emitting the light having a different wavelength from a wavelength of the laser light.

A light emitting device according to a third aspect of the present invention includes: a semiconductor laser element having first and second emission faces for emitting laser light, the first and second emission faces facing each other; a supporting base having first and second concave portions on first and second surfaces facing each other, and supporting the semiconductor laser element in such a manner that the first emission face of the semiconductor laser element is exposed to a bottom face of the first concave portion, and the second emission face of the semiconductor laser element is exposed to a bottom face of the second concave portion; a first light guiding body buried in the first concave portion of the supporting base, guiding a first laser light emitted from the first emission face of the semiconductor laser element, and having a first incident face to which the first laser light enters, and a third emission face from which the first laser light traveling through the first light guiding body is emitted, the first incident face of the first light guiding body being such a curved face that an incident angle of the first laser light is within a first predetermined range including the Brewster angle in a plane formed by a traveling direction of the first laser light and a short axis of a light emitting spot of the first laser light; a second light guiding body buried in the second concave portion of the supporting base, guiding a second laser light emitted from the second emission face of the semiconductor laser element, and having a second incident face to which the second laser light enters, and a fourth emission face from which the second laser light traveling through the second light guiding body is emitted, the second incident face of the second light guiding body being such a curved face that an incident angle of the second laser light is within a second predetermined range including the Brewster angle in a plane formed by a traveling direction of the second laser light and a short axis of a light emitting spot of the second laser light; a first fluorescent substance scattered in the first light guiding body, absorbing the first laser light, and emitting the first light having a different wavelength from a wavelength of the first laser light; and a second fluorescent substance scattered in the second light guiding body, absorbing the second laser light, and emitting the second light having a different wavelength from a wavelength of the second laser light.

DETAILED DESCRIPTION OF THE INVENTION

The following is a description of embodiments of the present invention, with reference to the accompanying drawings.

First Embodiment

Figure 1:
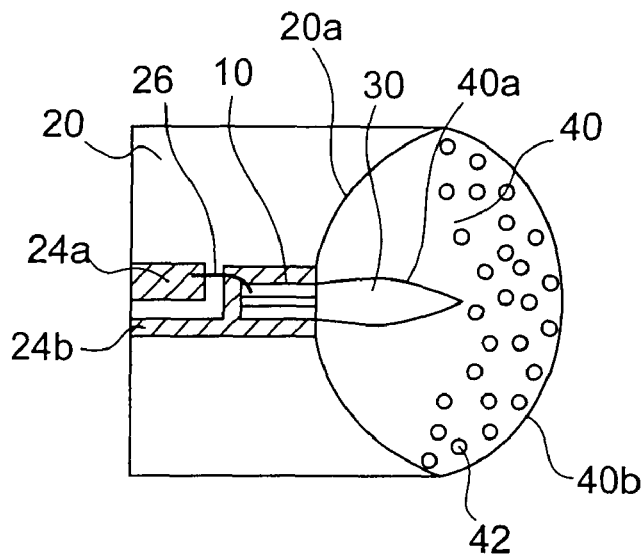
FIG. 1 is a horizontal sectional view of a light emitting device according to a first embodiment.
Figure 2:
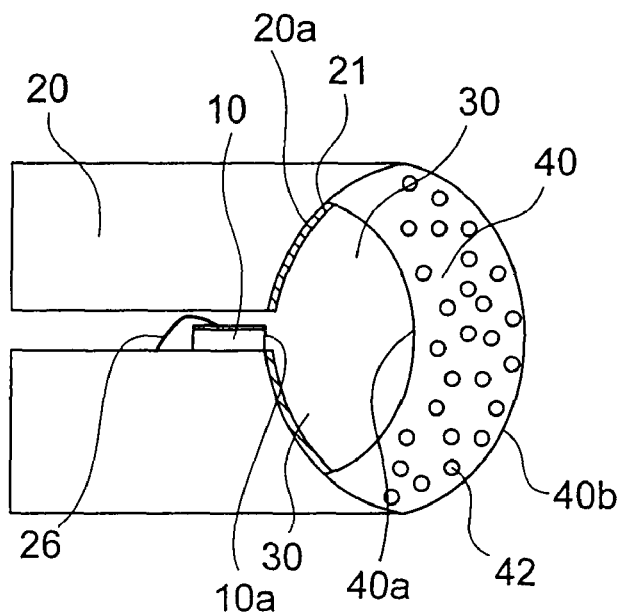
FIG. 2 is a vertical sectional view of the light emitting device of the first embodiment.

FIGS. 1 and 2 illustrate a light emitting device in accordance with a first embodiment of the present invention. FIG. 1 is a cross-sectional view of the light emitting device of this embodiment, taken along a line extending in the horizontal direction. FIG. 2 is a cross-sectional view of the light emitting device, taken along a line extending in the vertical direction. FIGS. 1 and 2 are cross-sectional views perpendicular to each other.

The light emitting device of this embodiment includes a laser diode 10 as a light source, a supporting base 20, and a light guiding body 40. The supporting base 20 has a concave portion 20a on its surface. The laser diode 10 is secured to the supporting base 20 in such a manner that the light emitting face of the laser diode 10 is exposed to the concave portion 20a. Electrodes 24a and 24b for energizing the laser diode 10 are provided inside the supporting base 20. One of the electrodes 24a and 24b is connected directly to the laser diode 10, and the other one is connected to the laser diode 10 via a bonding wire 26. The light guiding body 40 is buried in the concave portion 20a of the supporting base 20. The light guiding body 40 has an incident face 40a through which light from the laser diode 10 enters the light guiding body 40, and an emission face 40b through which the light that has entered the light guiding body 40 through the incident face 40a and traveled inside the light guiding body 40 is released. A hollow portion 30 is formed between the concave portion 20a of the supporting base 20 and the incident face 40a of the light guiding body 40. The laser light from the laser diode 10 passes through the hollow portion 30, and then reaches the incident face 40a of the light guiding body 40.

The hollow portion 30 has a slit-like shape in the horizontal cross-sectional view shown in FIG. 1, and has a great width in the vertical cross-sectional view shown in FIG. 2. In the light guiding body 40, a fluorescent substance 42 is scattered over a wide range. The supporting base 20 serves as a heat sink for releasing heat from the laser diode 10, and serves to secure and protect the laser diode 10 and the light guiding body 40.

Figure 3:
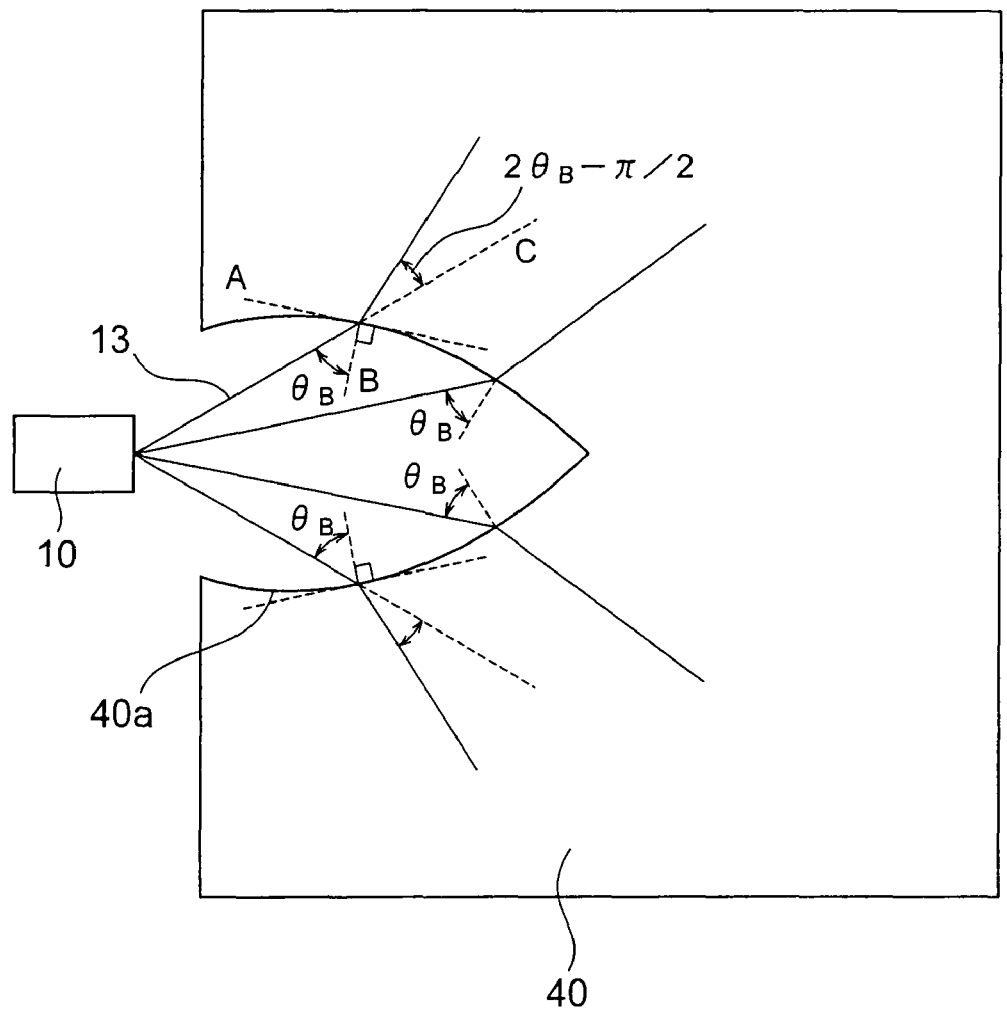
FIG. 3 is a diagram for explaining the Brewster's law.

The light guiding body 40 of this embodiment functions to guide laser light with high efficiency. This function is based on the Brewster's law. The incident face 40a of the light guiding body 40 is such a curved face that the incident angle of laser light 13 from the laser diode 10 is equal to the Brewster angle. FIG. 3 is a schematic view illustrating the relationship between the shape of the incident face 40a of the light guiding body 40 and the incident angle of the laser light 13. The schematic view is a cross-sectional view, taken along the plane defined by the traveling direction of the laser light 13 and the short-axis direction of the spot of the laser light 13. In FIG. 3, the dotted lines A and B indicate the tangent line and the normal line of the incident face 40a of the light guiding body 40 with respect to an incident point of the laser light. The angle of the normal line B at the incident point with respect to the traveling direction of the laser light is set as the incident angle of the laser light 13. The incident face of the light guiding body 40 is such a smooth curved face that the incident angle at any incident point of the laser light 13 is the Brewster angle $\theta_B$. The Brewster angle is an angle of the normal line of the interface between two media with respect to the light incident direction observed when the intensity reflectance of the P wave becomes zero in a case where light having a certain angle enters the interface between the two media having different refractive indexes. The Brewster angle is expressed by the following equation:

$$\theta_B = \arctan(n_2/n_1)$$

where $n_1$ represents the refractive index of the medium on the incident side, and $n_2$ represents the refractive index of the medium on the emission side. For example, when light from an atmosphere side enters the interface between the atmosphere having the refractive index of 1 and a transparent material having the refractive index of 1.47, the Brewster angle $\theta_B$ is 55.77°. The reflectance ratios of the s-polarization and the p-polarization at this angle are 13.49% and 0.00%, respectively, according to the Fresnel equation:

$$R_s = [\sin(\theta_i - \theta_t)/\sin(\theta_i + \theta_t)]^2$$

$$R_P = [\tan(\theta_i - \theta_t)/\tan(\theta_i + \theta_t)]^2$$

where $\theta_i$ represents the incident angle, and $\theta_t$ represents the refractive angle. Accordingly, the transmittance of the p-polarization becomes 100%.

In a hypothetical case where laser light having the linear polarization of 90% as the p-polarization enters a material having the refraction index of 1.47, 13.49% of the S-polarization component, which is 10% of the entire luminous flux, is reflected. Accordingly, in this case, the reflectance of all the luminous flux is approximately 0.01349 (=0.1×0.1349) or 1.349%, and 98.65% of the entire luminous flux is transmitted. However, if the incident angle shifts −10° with respect to the Brewster angle $\theta_B$, the s-polarization and the p-polarization under the above conditions are 8.75% and 0.64%, respectively. More specifically, 8.75% of the s-polarization component that occupies 10% of the entire luminous flux and 0.64% of the p-polarization component that occupies 90% of the entire luminous flux are reflected. Accordingly, the reflectance is 0.01451 (=0.9×0.0064+0.1×0.0875) or 1.451%, and the transmittance of the entire luminous flux is 98.55%. Meanwhile, if the incident angle shifts +5° with respect to the Brewster angle $\theta_B$, the s-polarization and the p-polarization are 17.27% and 0.326%, respectively, and the transmittance of the entire luminous flux is 97.98%.

As described above, the transmittance of the light beams having the linear polarization of 90% is maintained at approximately 98% while the incident angle with respect to the incident face is in the range of $\theta_B - 10°$ to $\theta_B + 5°$. The laser diode 10 has more excellent linear polarization than conventional light emitting diodes, and the polarization direction is normally parallel to the activation layer plane. With the use of a laser diode as a light source, it becomes possible to efficiently guide light through the interface between media having different refractive indexes. This is called the high-efficiency light guiding function of the light guide member 40 in this specification. The Brewster angle $\theta_B$ is a design parameter depending on the refractive index of the light guiding body.

The light guiding body 40 also has a light spot shape changing function. As shown in FIG. 3, the laser light incident at the Brewster angle $\theta_B$ is refracted by an angle $2\theta_B-\pi/2$. Accordingly, the emission angle of the laser light 13 can be widened by directing the normal line of the incident face toward the center of the short axis of the spot shape of the laser light 13, as in the light guiding body 40 shown in FIG. 3. This is called the light spot shape changing function of the light guiding body in this specification.

The light guiding body 40 further has the effect of reducing laser light leakage from the light guiding body 40. The light guiding body 40 absorbs laser light, and includes the fluorescent substance 42 that emits light having a different wavelength from the laser light. For example, the fluorescent substance 42 is distributed parallel to the emission face 42b of the light guiding body 40, and the distribution width in a direction perpendicular to the emission face 40b is set in the neighborhood of 100 µm, so that the laser light can be almost 100% absorbed by the fluorescent substance 42. In this manner, the laser light emission to the emission face 40b can be reduced. The distribution width of the fluorescent substance 42 is a design parameter that depends on the distribution, type, and mixing ratio of the fluorescent material.

Figure 4:
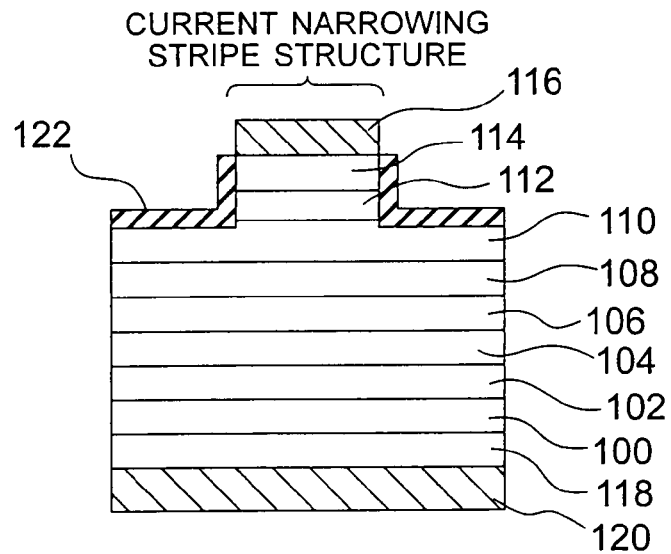
FIG. 4 is a cross-sectional view showing a specific example structure of the laser diode.
Figure 5:
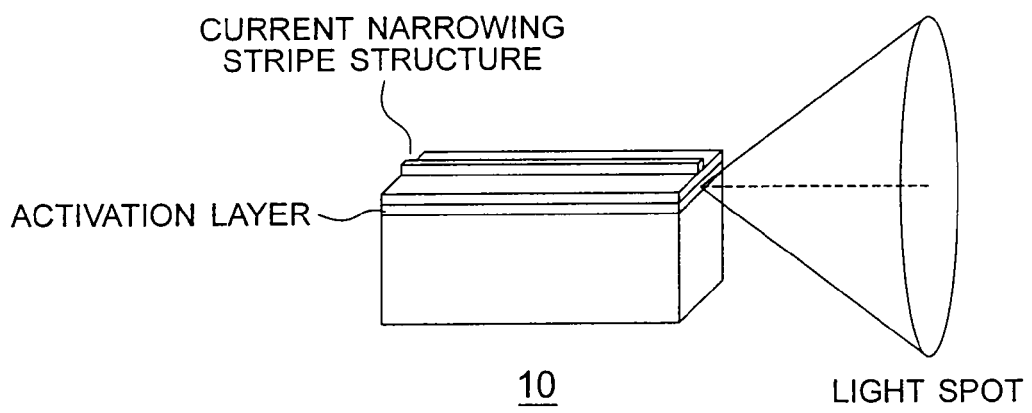
FIG. 5 is a perspective view of a laser diode as a specific example.

Referring now to FIGS. 4 and 5, the laser diode 10 is described. FIG. 4 is a cross-sectional view of the laser diode 10. FIG. 5 is a perspective view of the laser diode 10. The laser diode 10 is grown on a substrate. The laser diode 10 has a double-hetero structure that has n-type and p-type guide layer and clad layer on either side of the activation layer. The laser diode 10 is capable of emitting light of wavelengths 300 nm to 500 nm. For example, the laser diode 10 includes an n-type buffer layer 102, an n-type clad layer 104, an n-type guide layer 106, an activation layer 108, a p-type guide layer 110, a p-type clad layer 112, a p-type contact layer 114, and a p-electrode 116 formed in this order on a substrate 100, as shown in FIG. 4. An n-electrode 120 is further formed on the opposite face of the substrate 100 from the n-type buffer layer 102, with an n-type contact layer 118 being interposed between the substrate 100 and the n-electrode 120. The p-type clad layer 112 and the p-type contact layer 114 are each formed to have a smaller film-plane area than the p-type guide layer 110, so as to narrow the current flow. An insulator layer 122 covers the exposed portions of the upper face of the p-type guide layer 110 and the side faces of the p-type clad layer 112 and the p-type contact layer 114.

FIG. 5 schematically shows the layer structure of a laser diode of a conventional stripe type. Laser light is emitted from both or one of the emitting end faces perpendicular to the current narrowing stripe of the laser diode 10. The spot shape of the laser light is oval on a face perpendicular to the light axis (FIG. 5).

One of the n-electrode 120 and the p-electrode 116 is placed on the electrode 24a provided on the supporting base 20 (FIG. 1). The other one of the exposed electrodes of the laser diode 10 is connected to the electrode 24b with the bonding wire 26. The incident face 40a of the light guiding body 40 is such a curved face that the incident angle of the laser light is in the range of $\theta_B\pm$several degrees in the plane formed by the laser light 13 and the short-axis direction of the spot shape.

The light guiding body 40 can be formed with a member that is transparent with respect to the laser light emitted from the laser diode 10. The region (the hollow portion 30) between the incident face 40a of the light guiding body 40 and the laser diode 10 is filled with a gas or the atmosphere, for example. In such a case, the refractive index of the atmosphere is approximately 1. The hollow portion 30 may be a vacuum.

A preferable thickness of the fluorescent substance 42 widely distributed in the light guiding body 40 is approximately 100 µm with respect to the traveling direction of the laser light passing through the inside of the light guiding body 40. The refractive index of the light guiding body 40 preferably has a value close to the refractive index of the fluorescent substance 42, and, more preferably, is approximately 1.8.

Further, a reflection layer 21 for the light emitted from the fluorescent substance 42 may be formed in the concave portion 20a of the supporting base 20 (see FIG. 2).

As described above, this embodiment can provide a safe light emitting device that can use almost 100% of the incident light from a laser diode, and has less but uniform laser light leakage. Accordingly, when the light emitting device of this embodiment is used in a lighting system, highly uniform luminous fluxes can be achieved with high efficiency.

Second Embodiment

Figure 6:
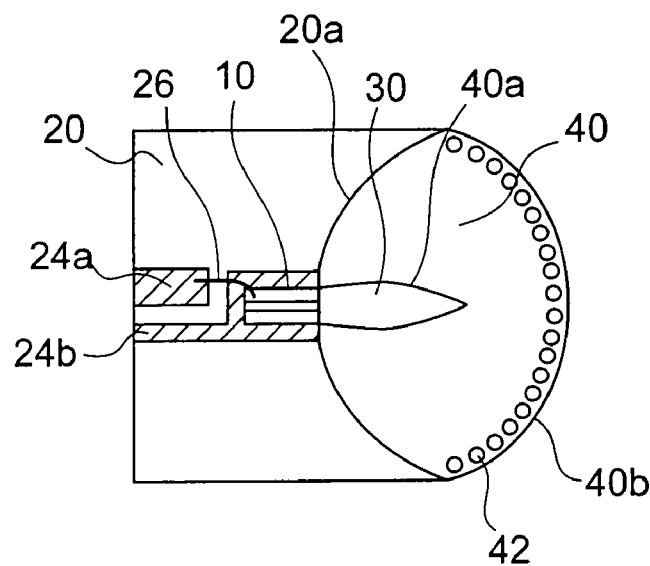
FIG. 6 is a horizontal cross-sectional view of a light emitting device according to a second embodiment.

FIG. 6 illustrates a light emitting device in accordance with a second embodiment of the present invention. The light emitting device of this embodiment has the same structure as the light emitting device of the first embodiment, except that the fluorescent substance 42 is distributed along the emission face 40b of the light guiding body 40. The distribution of the laser light received by the fluorescent substance 42 can be changed in accordance with the shape of the emission face 40b of the light guiding body 40. For example, the surface density of the laser light received by the fluorescent substance can be adjusted by changing the shape of the emission face of the light guiding body.

(Modification)

Figure 7:
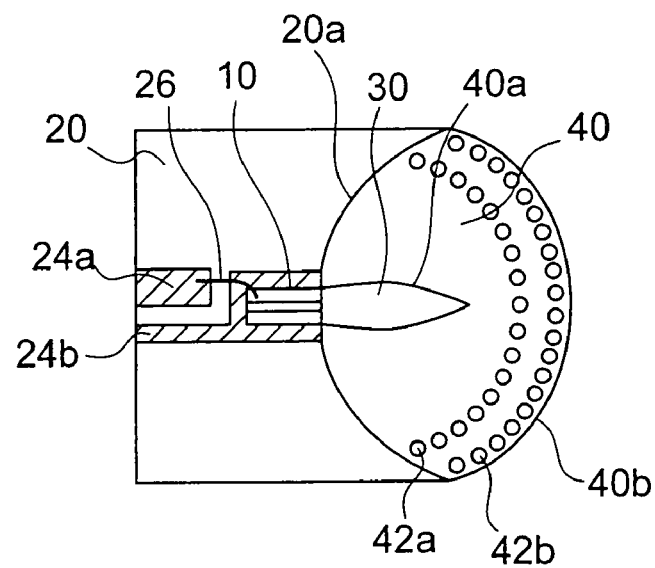
FIG. 7 is a horizontal cross-sectional view of a light emitting device according to a modification of the second embodiment.

As shown in FIG. 7, the fluorescent substance in the light guiding body 40 may be fluorescent substances 42a and 42b formed with two or more layer-like structures. With the layer-like fluorescent substances, the light reabsorption between the fluorescent substances of different kinds can be made smaller than in a case where a plurality of fluorescent substances are mixed, and it becomes easier to design synthetic light on a chromaticity diagram.

Third Embodiment

Figure 8:
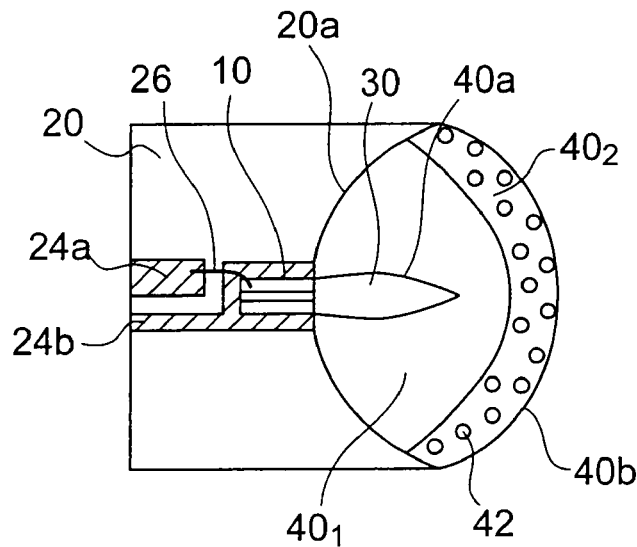
FIG. 8 is a horizontal cross-sectional view of a light emitting device according to a third embodiment.

FIG. 8 illustrates a light emitting device in accordance with a third embodiment of the present invention. The light emitting device of this embodiment is the same as the light emitting device of the first embodiment shown in FIG. 1, except that the light guiding body 40 is divided into a light guiding member $40_1$ not including the fluorescent substance 42 and a light guiding member $40_2$ including the fluorescent substance 42. With this arrangement, the light guiding member $40_2$ containing the fluorescent substance 42 can be formed separately from the light guiding member $40_1$, and it becomes easier to produce the light guiding member $40_2$ containing the fluorescent substance 42 and the light guiding member $40_1$ not containing the fluorescent substance 42.

Fourth Embodiment

Figure 9:
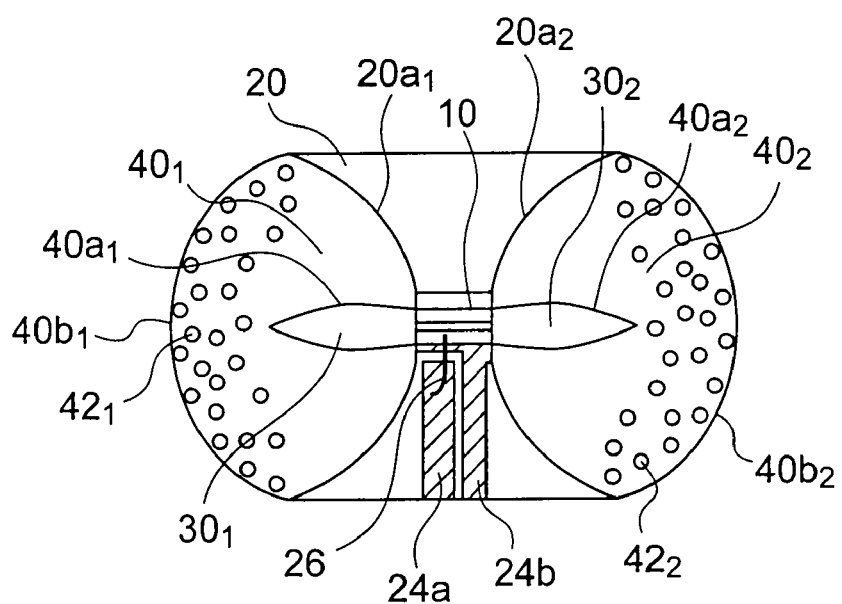
FIG. 9 is a horizontal cross-sectional view of a light emitting device according to a fourth embodiment.

FIG. 9 illustrates a light emitting device in accordance with a fourth embodiment of the present invention. The light emitting device of this embodiment includes a laser diode 10, a supporting base 20, and light guiding members $40_1$ and $40_2$.

The laser diode 10 has a pair of emission faces facing each other. The supporting base 20 has concave portions $20a_1$ and $20a_2$ formed on the pair of surfaces facing each other. The laser diode 10 is secured to the supporting base 20, so that the pair of emission faces of the laser diode 10 are exposed to the concave portions $20a_1$ and $20a_2$. Electrodes 24a and 24b for energizing the laser diode 10 are provided inside the supporting base 20. One of the electrodes 24a and 24b is connected directly to the laser diode 10, and the other one is connected to the laser diode 10 via a bonding wire 26.

The light guiding members $40_1$ and $40_2$ are respectively buried in the concave portions $20a_1$ and $20a_2$ of the supporting base 20. The light guiding member $40_1$ includes an incident face $40a_1$ through which the light from the laser diode 10 enters the light guiding member $40_1$ and an emission face $40b_1$ through which the light that has entered through the incident face $40a_1$ and traveled inside the light guiding member $40_1$ is released to the outside. The light guiding member $40_2$ includes an incident face $40a_2$ through which the light from the laser diode 10 enters the light guiding member $40_2$ and an emission face $40b_2$ through which the light that has entered through the incident face $40a_2$ and traveled inside the light guiding member $40_2$ is released to the outside. A hollow portion $30_1$ is formed between the concave portion $20a_1$ of the supporting base 20 and the incident face $40a_1$ of the light guiding member $40_1$, and the laser light from the laser diode 10 enters the incident face $40a_1$ of the light guiding member $40_1$ through the hollow portion $30_1$. A hollow portion $30_2$ is formed between the concave portion $20a_2$ of the supporting base 20 and the incident face $40a_2$ of the light guiding member $40_2$, and the laser light from the laser diode 10 enters the incident face $40a_2$ of the light guiding member $40_2$ through the hollow portion $30_2$. Those hollow portions $30_1$ and $30_2$ each have a slit-like shape in the horizontal cross-sectional view shown in FIG. 9, and have a great width in a vertical cross-sectional view as in the case of the first embodiment. In the light guiding members $40_1$ and $40_2$, fluorescent substances $42_1$ and $42_2$ are each scattered over a wide range. The supporting base 20 serves as a heat sink for releasing heat from the laser diode 10, and serves to secure and protect the laser diode 10 and the light guiding members $40_1$ and $40_2$.

In the light guiding members $40_1$ and $40_2$ of this embodiment, each of the incident faces $40a_1$ and $40a_2$ is such a curved face that the incident angle of the laser light 13 from the laser diode 10 is equal to the Brewster angle.

In the light emitting device of this embodiment having the above structure, the light output of each emission end face can be reduced by causing the laser diode 10 to emit light from both emission faces.

In this embodiment, a light reflection film may be provided on the surface of each concave portion 20a of the supporting base 20, as in the first to third embodiments.

Fifth Embodiment

Figure 10:
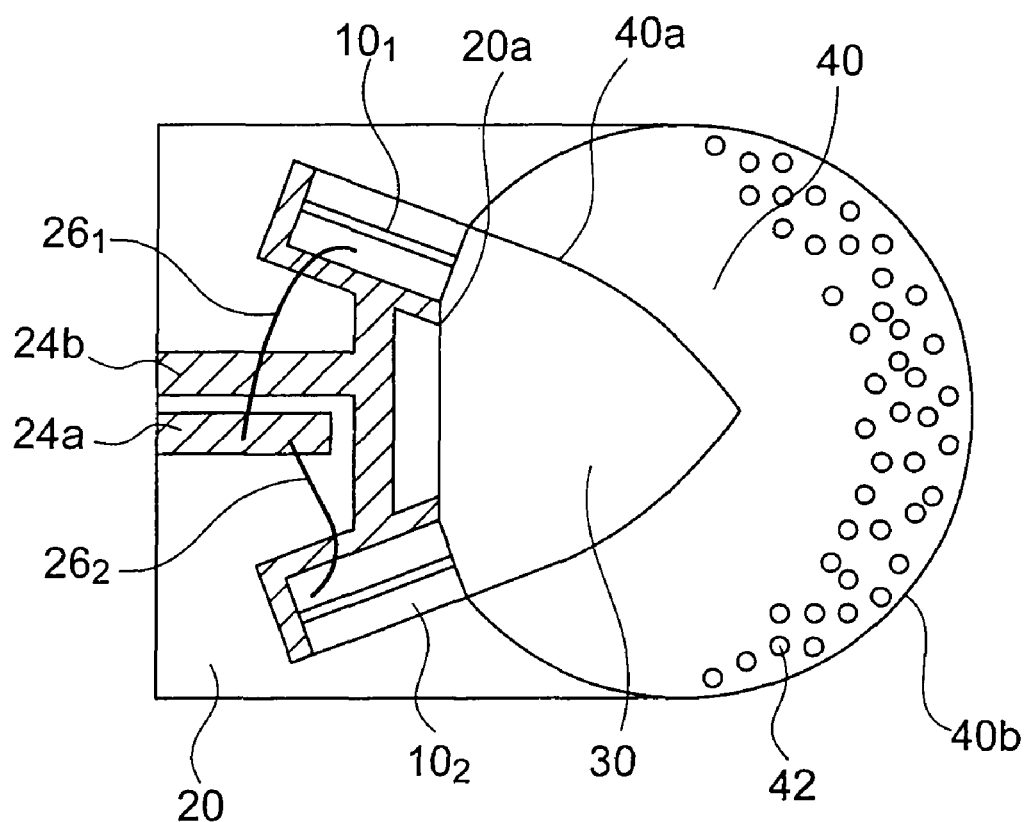
FIG. 10 is a horizontal cross-sectional view of a light emitting device according to a fifth embodiment.

FIG. 10 illustrates a light emitting device in accordance with a fifth embodiment of the present invention. The light emitting device of this embodiment is the same as the light emitting device of the first embodiment shown in FIG. 1, except that two laser diodes are provided. The two laser diodes $10_1$ and $10_2$ are secured to the supporting base 20, so that each emission face is exposed to the concave portion 20a. The laser diodes $10_1$ and $10_2$ are electrically connected to one of the electrodes 24a and 24b, and are electrically connected to the other one of the electrodes 24a and 24b via bonding wires $26_1$ and $26_2$. The incident face 40a of the light guiding body 40 is such a curved face that the incident angle of the laser light emitted from each of the laser diodes $10_1$ and $10_2$ is equal to the Brewster angle. In this embodiment, however, the incident face 40a of the light guiding body 40 has an asymmetrical shape in a horizontal plane with respect to the laser light emitted from each of the laser diodes $10_1$ and $10_2$. With this arrangement, the laser light in the vicinity of the light axis having high light density can efficiently enter the light guiding body 40. It is preferable that the angle of the light axes of the laser diodes $10_1$ and $10_2$ with respect to each other is approximately twice as large as the Brewster angle $\theta_B$, and the center axes of the laser light entering the light guiding body under such conditions are parallel to each other.

Each of the light guiding members of the above embodiments is preferably made of a silicon-based resin, a polymer, polyimide, ceramics, glass, or a mixture of two or more of those materials.

Each of the fluorescent substances of the above embodiments should preferably contain a yttrium aluminum garnet material, a terbium aluminum garnet material, zinc selenide sulfide, or nitrided silicon aluminum.

As described so far, each of the embodiments of the present invention can provide a light emitting device that has the highest possible light emitting efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A light emitting device comprising:
    a semiconductor laser element having a first emission face for emitting laser light;
    a supporting base having a concave portion on a surface, and supporting the semiconductor laser element in such a manner that the first emission face is exposed to a bottom face of the concave portion;
    a light guiding body buried in the concave portion of the supporting base, guiding the laser light emitted from the semiconductor laser element, and having an incident face to which the laser light enters, and a second emission face from which the laser light traveling through the light guiding body is emitted, the incident face of the light guiding body being such a curved face that an incident angle of the laser light is within a predetermined range including the Brewster angle in a plane formed by a traveling direction of the laser light and a short axis of a light emitting spot of the laser light; and
    a fluorescent substance scattered in the light guiding body, absorbing the laser light, and emitting the light having a different wavelength from a wavelength of the laser light,
    wherein the predetermined range is the range of $\theta_B-10°$ to $\theta_B+5°$, with $\theta_B$ representing the Brewster angle.

2. The device according to claim 1, wherein an emission wavelength of the semiconductor laser element is in the range of 300 nm to 500 nm.

3. The device according to claim 1, wherein the light guiding body is formed with one of a silicon-based resin, a polymer, polyimide, ceramics, and glass, or a mixture of the materials.

4. The device according to claim 1, wherein the light guiding body has a stacked structure formed with a first light guiding member and a second light guiding member made of a different material from the first light guiding member.

5. The device according to claim 1, wherein the fluorescent substance contains one of a yttrium aluminum garnet material, a terbium aluminum garnet material, zinc selenide sulfide, and nitrided silicon aluminum.

6. The device according to claim 1, further comprising a light reflection film that is formed on a surface of the concave portion of the supporting base.

7. The device according to claim 1, wherein the fluorescent substance is distributed along the second emission face.

8. A light emitting device comprising:
first and second semiconductor laser elements having a first and second emission faces for emitting laser light respectively;
a supporting base having a concave portion on a surface, and supporting the first and second semiconductor laser elements in such a manner that the first and second emission faces are exposed to a bottom face of the concave portion;
a light guiding body buried in the concave portion of the supporting base, guiding the laser light emitted from each of the first and second semiconductor laser elements, and having an incident face to which the laser light emitted from the each of the first and second semiconductor laser elements enters and a third emission face from which the laser light traveling through the light guiding body is emitted, the incident face of the light guiding body being such a curved face that an incident angle of the laser light is within a predetermined range including the Brewster angle in a plane formed by a traveling direction of the laser light and a short axis of a light emitting spot of the laser light; and
a fluorescent substance scattered in the light guiding body, absorbs the laser light, and emitting the light having a different wavelength from a wavelength of the laser light,
wherein the predetermined range is the range of $\theta_B-10°$ to $\theta_B+5°$, with $\theta_B$ representing the Brewster angle.

9. The device according to claim 8, wherein an emission wavelength of each of the semiconductor laser elements is in the range of 300 nm to 500 nm.

10. The device according to claim 8, wherein the light guiding body is formed with one of a silicon-based resin, a polymer, polyimide, ceramics, and glass, or a mixture of the materials.

11. The device according to claim 8, wherein the light guiding body has a stacked structure formed with a first light guiding member and a second light guiding member made of a different material from the first light guiding member.

12. The device according to claim 8, wherein the fluorescent substance contains one of a yttrium aluminum garnet material, a terbium aluminum garnet material, zinc selenide sulfide, and nitrided silicon aluminum.

13. The device according to claim 8, further comprising a light reflection film that is formed on a surface of the concave portion of the supporting base.

14. The device according to claim 8, wherein the fluorescent substance is distributed along the third emission face.

15. A light emitting device comprising:
a semiconductor laser element having first and second emission faces for emitting laser light, the first and second emission faces facing each other;
a supporting base having first and second concave portions on first and second surfaces facing each other, and supporting the semiconductor laser element in such a manner that the first emission face of the semiconductor laser element is exposed to a bottom face of the first concave portion, and the second emission face of the semiconductor laser element is exposed to a bottom face of the second concave portion;
a first light guiding body buried in the first concave portion of the supporting base, guiding a first laser light emitted from the first emission face of the semiconductor laser element, and having a first incident face to which the first laser light enters, and a third emission face from which the first laser light traveling through the first light guiding body is emitted, the first incident face of the first light guiding body being such a curved face that an incident angle of the first laser light is within a first predetermined range including the Brewster angle in a plane formed by a traveling direction of the first laser light and a short axis of a light emitting spot of the first laser light;
a second light guiding body buried in the second concave portion of the supporting base, guiding a second laser light emitted from the second emission face of the semiconductor laser element, and having a second incident face to which the second laser light enters, and a fourth emission face from which the second laser light traveling through the second light guiding body is emitted, the second incident face of the second light guiding body being such a curved face that an incident angle of the second laser light is within a second predetermined range including the Brewster angle in a plane formed by a traveling direction of the second laser light and a short axis of a light emitting spot of the second laser light;
a first fluorescent substance scattered in the first light guiding body, absorbing the first laser light, and emitting the first light having a different wavelength from a wavelength of the first laser light; and
a second fluorescent substance scattered in the second light guiding body, absorbing the second laser light, and emitting the second light having a different wavelength from a wavelength of the second laser light.

16. The device according to claim 15, wherein an emission wavelength of the semiconductor laser element is in the range of 300 nm to 500 nm.

17. The device according to claim 15, wherein each of the first and second light guiding bodies is formed with one of a silicon-based resin, a polymer, polyimide, ceramics, and glass, or a mixture of the materials.

18. The device according to claim 15, wherein each of the first and second light guiding bodies has a stacked structure formed with a first light guiding member and a second light guiding member made of a different material from the first light guiding member.

19. The device according to claim 15, wherein the first and second fluorescent substances contain one of a yttrium aluminum garnet material, a terbium aluminum garnet material, zinc selenide sulfide, and nitrided silicon aluminum.

20. The device according to claim 15, further comprising a light reflection film that is formed on surfaces of the first and second concave portions of the supporting base.

21. The device according to claim 15, wherein the first and second fluorescent substances are distributed along the third and fourth emission faces respectively.

22. The device according to claim 15, wherein the first and second predetermined ranges are the range of $\theta_B-10°$ to $\theta_B+5°$, with $\theta_B$ representing the Brewster angle.

* * * * *